United States Patent
Berens

(10) Patent No.: US 11,424,754 B1
(45) Date of Patent: Aug. 23, 2022

(54) NOISE-SHAPING ANALOG-TO-DIGITAL CONVERTER

(71) Applicant: NXP B.V., Eindhoven (NL)

(72) Inventor: Michael Todd Berens, Austin, TX (US)

(73) Assignee: NXP B.V., San Jose, CA (US)

( * ) Notice: Subject to any disclaimer, the term of this patent is extended or adjusted under 35 U.S.C. 154(b) by 0 days.

(21) Appl. No.: 17/328,740

(22) Filed: May 24, 2021

(51) Int. Cl.
*H03M 1/10* (2006.01)
*H03M 1/06* (2006.01)
*H03M 1/46* (2006.01)

(52) U.S. Cl.
CPC ....... *H03M 1/1071* (2013.01); *H03M 1/0617* (2013.01); *H03M 1/1009* (2013.01); *H03M 1/462* (2013.01); *H03M 1/466* (2013.01); *H03M 1/468* (2013.01)

(58) Field of Classification Search
CPC ............. H03M 1/1071; H03M 1/0617; H03M 1/1009; H03M 1/462; H03M 1/466; H03M 1/468; H03M 3/426
See application file for complete search history.

(56) References Cited

U.S. PATENT DOCUMENTS

| | | |
|---|---|---|
| 7,880,650 B2 | 2/2011 | Feddeler et al. |
| 8,510,073 B2 | 8/2013 | Dasnurkar |
| 9,030,346 B2 | 5/2015 | Dey et al. |
| 9,197,240 B1 * | 11/2015 | Kinyua ................. H03M 1/002 |
| 9,425,818 B1 * | 8/2016 | Rajaee .................... H03M 3/32 |
| 10,243,577 B1 | 3/2019 | Berens et al. |
| 10,630,311 B1 | 4/2020 | Chen et al. |

OTHER PUBLICATIONS

S. Li et al., "A 13-ENOB Second-Order Noise-Shaping SAR ADC Realizing Optimized NTF Zeros Using the Error-Feedback Structure," IEEE Journal of Solid-State Circuits, vol. 53, No. 12, Dec. 2018, p. 3484 3496.
F. van der Goes et al., "A 1.5 mW 68 dB SNDR 80 Ms/s 2x Interleaved Pipelined SAR ADC in 28 nm CMOS," IEEE Journal of Solid-State Circuits, vol. 49, No. 12, Dec. 2014, pp. 2835-2845.
L. Jie et al., "A Calibration-Free Time-Interleaved Fourth-Order Noise-Shaping SAR ADC," IEEE Journal of Solid-State Circuits, vol. 54, No. 12, Sep. 25, 2019, pp. 3386-3395.
D. Osipov et al., "Noise Shaping in SAR ADC," Electronics and Energetics, vol. 30, No. 1, Mar. 2017, pp. 1-14.
"Understanding SAR ADCs: Their Architecture and Comparison with Other ADCs," Tutorial 1080, Maxim Integrated, Oct. 2, 2001, 7 pages.
"Successive-approximation ADC," Wikipedia, Sep. 28, 2020, 4 pages.

* cited by examiner

*Primary Examiner* — Khai M Nguyen

(57) ABSTRACT

Testing of the noise-shaping circuitry within a successive approximation register ("SAR") analog-to-digital converter ("ADC") ("SAR ADC") to ensure it will function as expected, while also providing a method for calibrating the coefficients of the noise-shaping circuitry. Programmable/trimmable circuit component(s) can be used to calibrate the coefficient(s) of the SAR ADC. Digital logic within the SAR engine enables it to selectively skip portions of the ADC conversion process and to use voltage references rather than an analog voltage input signal in sample mode during such test/calibration modes.

20 Claims, 11 Drawing Sheets

NOISE-SHAPING ANALOG-TO-DIGITAL CONVERTER

TECHNICAL FIELD

The present disclosure relates in general to data conversion circuits, and in particular, to analog-to-digital converters ("ADC") having a noise-shaping function.

BACKGROUND

An analog-to-digital converter ("ADC") converts an analog input to a digital output. One type of ADC circuit is a Successive Approximation Register ("SAR") ADC ("SAR ADC"). SAR ADCs are used to convert a continuous analog signal into a binary value. For example, a 12-bit SAR ADC converts an analog input voltage into a 12-bit binary representation. The SAR ADC operates using a binary search principle and converges to a digital output for each analog-to-digital conversion. A SAR ADC includes a digital-to-analog converter ("DAC") and a comparator in a feedback loop with a SAR register. The DAC may be formed of an array of binary-weighted elements, such as capacitors and/or resistors. Each binary-weighted element corresponds to a binary digit of a corresponding binary representation. To generate a 12-bit binary representation, the DAC includes twelve binary-weighted elements and a dummy element.

During an analog-to-digital conversion, an input voltage is sampled during a sample phase. During a compare phase, the DAC binary-weighted elements are used to successively approximate the input voltage. At each successive approximation step, the comparator output is stored in the SAR register and the resulting digital word that is output provides the digital representation of the analog input voltage.

SAR ADCs are popular for their power efficiency, especially for resolutions up to about 12 bits. Beyond 12 bits the comparator and pre-amplifier noise become significant limitations on the signal-to-(noise+distortion) ("SNDR") and, as a result, the achievable effective number of bits ("ENOB"). Oversampling is one way to reduce this noise, but basic oversampling only gains 3 dB of signal-to-noise ratio ("SNR") for every factor of 2 increase in oversampling ratio.

By adding noise shaping to a SAR ADC, the SNR gains can be increased significantly. For $1^{st}$ order noise shaping, up to 9 dB may be gained per factor of 2, and for $2^{nd}$ order noise shaping, up to 15 dB may be gained per factor of 2 increase in oversampling. The noise shaping pushes both the quantization noise and the comparator/pre-amp noise to higher frequencies outside the input signal bandwidth. The frequencies are then filtered at the ADC output. Because of this significant performance increase, noise-shaping SAR ADCs are becoming more prevalent.

To implement noise shaping, the residue voltage that remains at the end of a successive approximation is stored and provided in some proportion to the next ADC conversion. Residue voltage is a voltage that remains after a signal is quantized. For example, in $1^{st}$ order noise shaping, the input voltage during a second ADC conversion is effectively adjusted by a proportion of the residue voltage from the first ADC conversion, i.e., $V_{in}(n)=V_{in}(n)+a^*V_{res}(n-1)$. And for $2^{nd}$ order noise shaping, the previous two residue voltages are stored and utilized to effectively adjust the next ADC conversion, i.e., $V_{in}(n)=V_{in}(n)+a^*V_{res}(n-1)+b^*V_{res}(n-2)$.

Values for the noise-shaping coefficients (a, b, etc.) are selected/determined in order to achieve a desired noise transfer function ("NTF"), which determines how noise sources within the ADC, such as quantization noise and comparator noise, are filtered/shaped (for example, to minimize the noise power in the input signal band). They are typically implemented with circuit components such as capacitive dividers and amplifier gains. In any noise-shaping technique, there will be some variation in these coefficients, for example, as a result of coefficient variation from capacitor matching and amplifier gain variation. Variation in the coefficients can reduce the noise-shaping benefits and lead to quantization overload and possible instability if there is not enough redundancy in the ADC. This variation can reduce the effectiveness of the ADC noise shaping, limiting the accuracy of the ADC and reducing input bandwidth.

DETAILED DESCRIPTION

Noise-shaping SAR ADCs have variation in the noise transfer function ("NTF") due to coefficient variation from capacitor matching and amplifier gain variation. This variation can reduce the effectiveness of the noise-shaping function within the ADC, limiting the accuracy of the ADC and reducing input bandwidth. Aspects of the present disclosure provide a technique for testing of the noise-shaping circuitry within a SAR ADC to ensure it will function as expected, while also providing a method for calibrating the NTF coefficients. It can also be used in conjunction with programmable/trimmable circuit component(s) to calibrate the NTF coefficient(s) of a SAR ADC. Embodiments of the present disclosure may be implemented with additions/modifications to the digital logic of a SAR engine to enable it to selectively skip portions of the ADC conversion process and to use $V_{REFH}/V_{REFL}$ switches rather than $V_{IN}$ switches in sample mode during such test/calibration modes. Though described herein with respect to single-ended SAR ADCs, embodiments of the present disclosure are also applicable to differential SAR ADCs.

Figure 1:
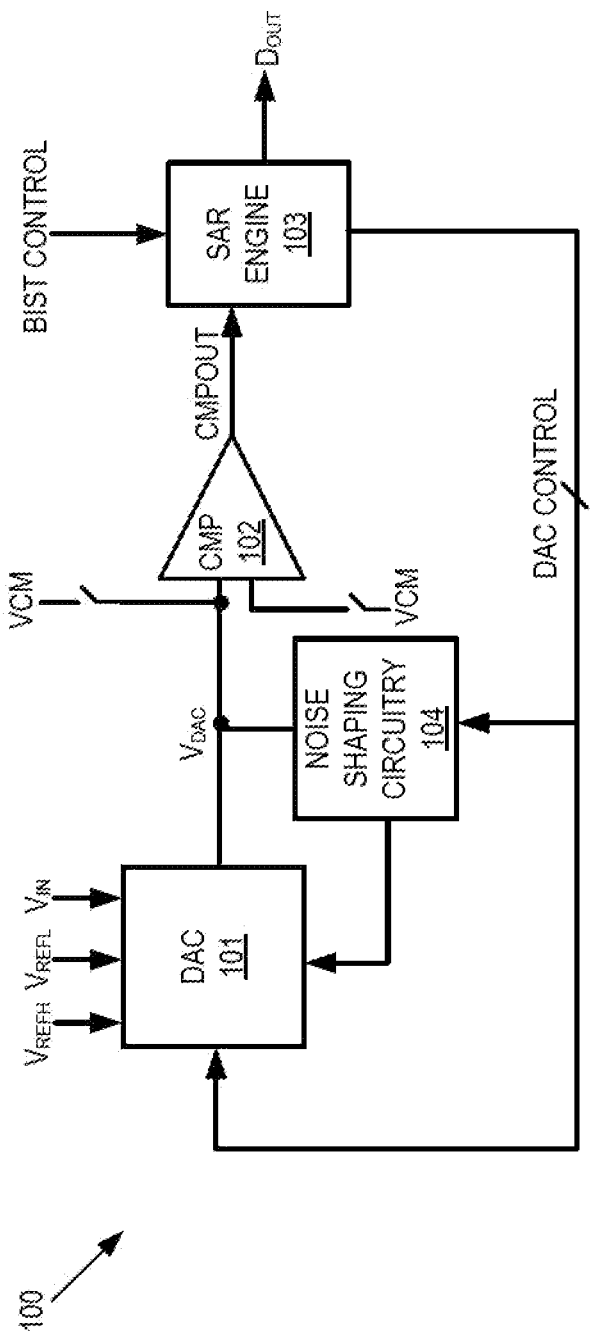
FIG. 1 illustrates an exemplary block diagram of a noise-shaping SAR ADC configured in accordance with embodiments of the present disclosure.

Referring to FIG. 1, there is illustrated an exemplary block diagram of a noise-shaping SAR ADC 100 configured in accordance with embodiments of the present disclosure. During normal operation, the SAR ADC 100 converts an analog voltage input signal ($V_{IN}$) to a corresponding binary value ($D_{OUT}$). Operation of the DAC 101 with respect to a normal conversion operation is known in the art and will not be discussed in full detail. The SAR ADC 100 includes a DAC 101, a comparator (CMP) 102, an SAR engine (also referred to herein as SAR circuitry) 103, and noise-shaping circuitry 104.

In accordance with embodiments of the present disclosure, the SAR ADC 100 has a resolution of N bits in which N is a positive integer greater than 1. As will be further described with respect to FIG. 3, the DAC 101 may be implemented with a capacitor array that includes binary-weighted capacitors in which each binary-weighted capacitor corresponds to a binary digit of the binary value output from the SAR ADC 100. The DAC 101 is coupled to supply voltage terminals providing a high voltage reference signal, $V_{REFH}$, and a low voltage reference signal, $V_{REFL}$, and receives an analog voltage input signal $V_{IN}$. The DAC 101 receives DAC Control signals from the SAR engine 103, while providing an output voltage ($V_{DAC}$) to a first input of the comparator 102. In a manner well-known in the art, switches within the DAC 101 are operable under the DAC Control signals to selectively switch the bottom plates of the binary-weighted capacitors to the $V_{REFH}$, $V_{REFL}$, and $V_{IN}$ inputs. As will be further described herein, the DAC Control signals are utilized to control these switches for performing the testing of the noise-shaping circuitry 104 in accordance with embodiments of the present disclosure.

Both of the inputs of the comparator 102 are coupled to common mode voltage, VCM, which may be via switches. An output of the comparator 102, CMPOUT, is provided to the SAR engine 103. The SAR engine 103 stores the binary output provided by the comparator 102 subsequent to each comparison.

The noise-shaping circuitry 104 samples the remaining voltage (residue voltage) at the output of the DAC 101 after a conversion is completed and feeds a proportion of this voltage back to the DAC 101 to modify the input voltage of the next conversion. For $2^{nd}$ order noise shaping and beyond, the noise-shaping circuitry 104 may store multiple residue voltages. Each residue voltage is multiplied by a coefficient prior to adjusting the input voltage of subsequent conversions. The values of the coefficients determine the NTF of the SAR ADC 100.

Figure 2:
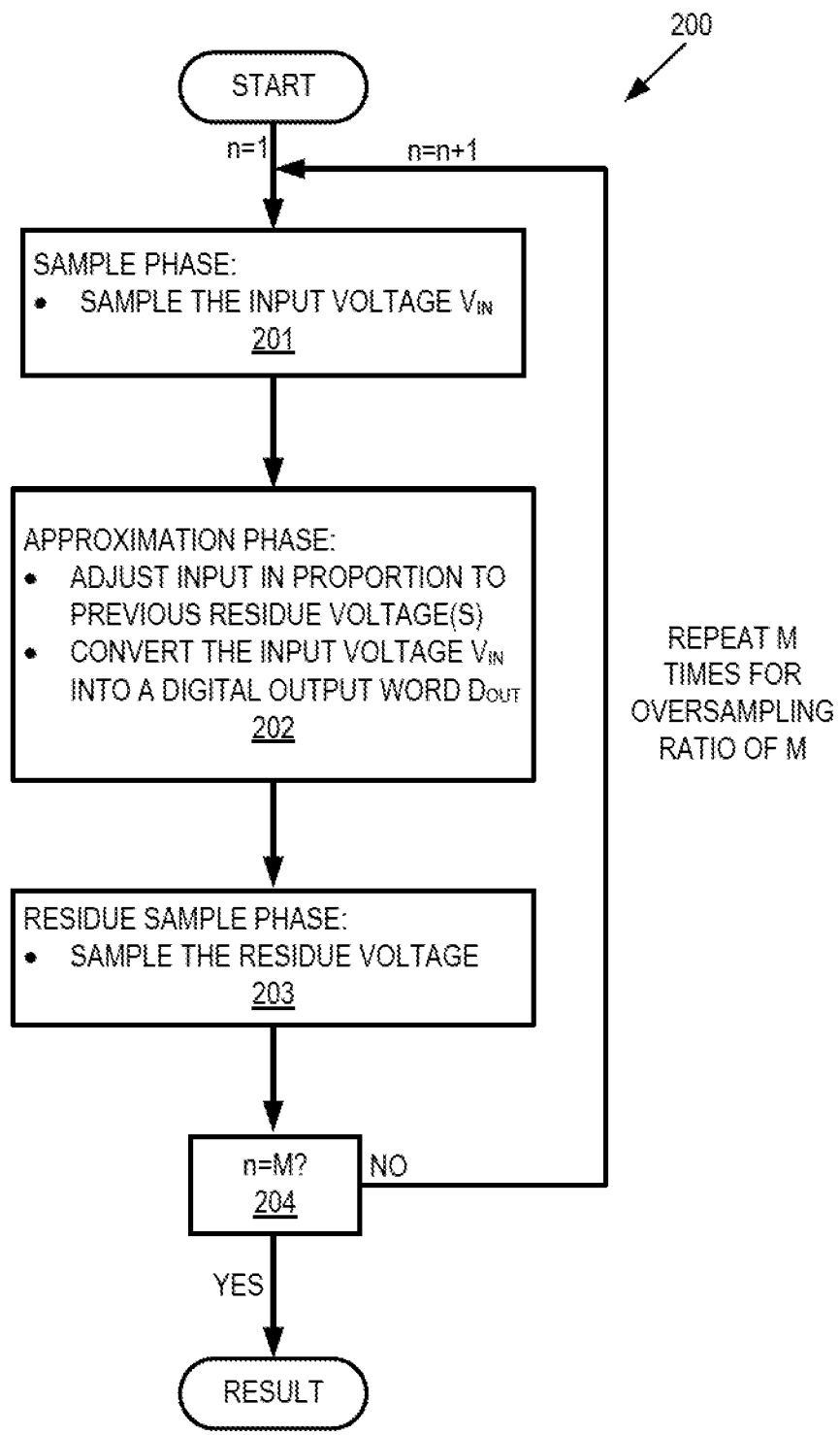
FIG. 2 illustrates a flowchart block diagram of operation of a noise-shaping SAR ADC in accordance with embodiments of the present disclosure.

FIG. 2 illustrates a flowchart block diagram of operation 200 of a noise-shaping SAR ADC in accordance with embodiments of the present disclosure. There are three phases in noise-shaping SAR ADCs. In a sample phase 201, the input voltage $V_{IN}$ is sampled. In a successive approximation phase 202, the N bits of the SAR ADC 100 are converted in order to convert the input voltage $V_{IN}$ into a digital output word $D_{OUT}$. In a residue sampling phase 203, this residue voltage is sampled by the noise-shaping circuitry 104, which inputs a signal into the DAC 101 so that there is a proportional adjustment made to the input voltage for the next conversion. The residue voltage remaining at the output of the DAC 101/input of the comparator 102 after an approximation is a combination of quantization noise plus any errors due to noise during the approximation. This shapes the quantization noise out of the input signal bandwidth into higher frequencies that are then filtered out. For $2^{nd}$ order noise shaping, two subsequent residue voltages are saved by the noise-shaping circuitry 104, and the input voltage to the DAC 101 is adjusted by a proportion of each of these residue voltages.

Figure 3:
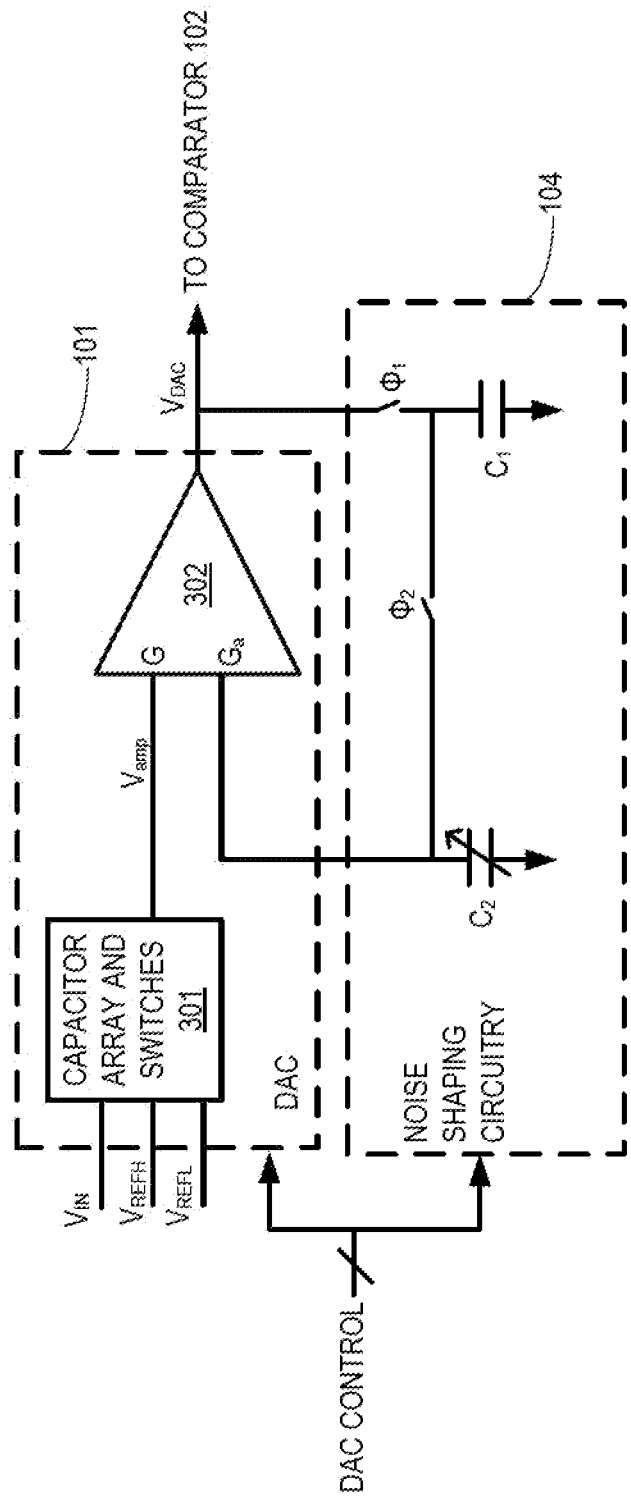
FIG. 3 illustrates a circuit block diagram of first order noise-shaping circuitry configured in accordance with embodiments of the present disclosure.
Figure 4:
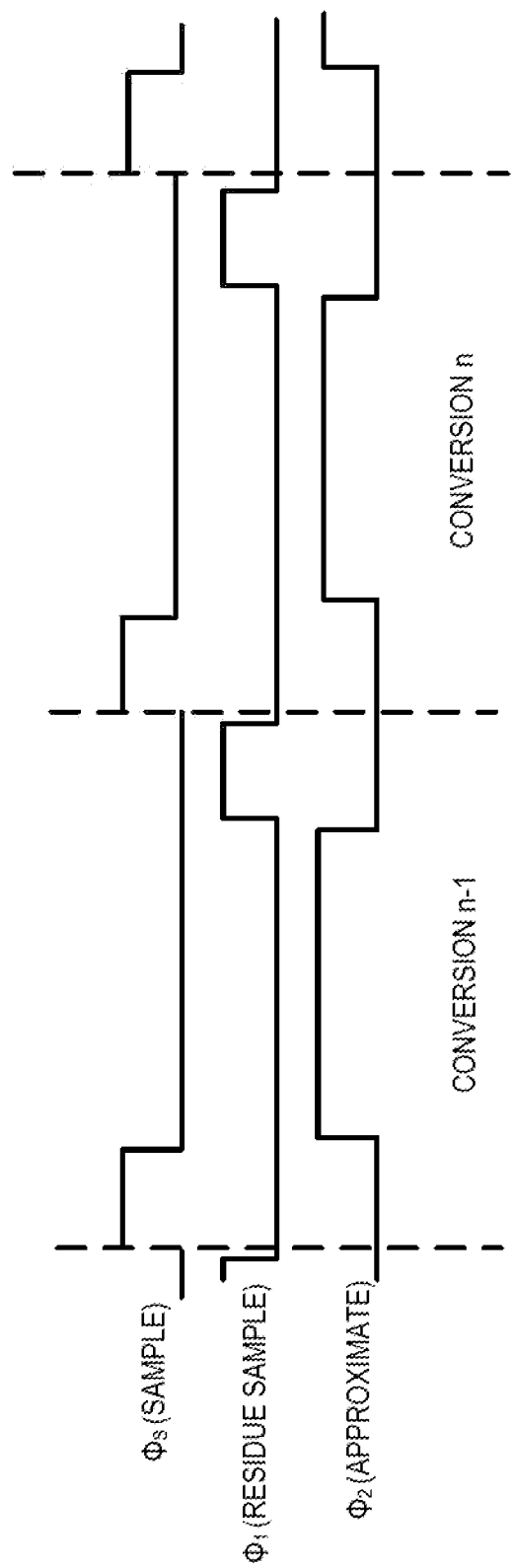
FIG. 4 illustrates an exemplary timing of signals of the noise-shaping circuitry of FIG. 3 in accordance with embodiments of the present disclosure.

FIG. 3 illustrates a circuit block diagram of an example of coupling of $1^{st}$ order noise-shaping circuitry to a DAC of a SAR ADC in accordance with embodiments of the present disclosure, wherein the $1^{st}$ order noise-shaping circuitry may be utilized for the noise-shaping circuitry 104. The noise-shaping circuitry 104 is depicted as a single-ended implementation, but a differential implementation may also be configured in a similar manner. In the illustration of FIG. 3, the summing amplifier 302 is considered part of the DAC 101. FIG. 4 illustrates an exemplary timing of signals of the noise-shaping circuitry 101 in accordance with embodiments of the present disclosure.

Referring to FIGS. 3-4, in phase $\phi_s$ of the $n^{th}$ conversion, the input $V_{IN}(n)$ is sampled onto the DAC capacitor array 301 with its output $V_{amp}$ supplied to a first input, G, of the summing amplifier 302. In phase $\phi_2$, the residue voltage from the previous conversion, $V_{res}(n-1)$, is applied to a second input, $G_a$, of the summing amplifier 302 with a coefficient of $a=G_a*C_1/(C_1+C_2)$. This effectively adjusts the input voltage $V_{IN}(n)$ by $a*V_{res}(n-1)$ as seen by the comparator 102. In phase $\phi_1$, after the successive approximation is complete, the new residue $V_{res}(n)$ is sampled onto the capacitor $C_1$. The phases, $\phi_1$ and $\phi_2$, may be implemented utilizing switches within the noise-shaping circuitry 104 under control from DAC Control signals received from the SAR engine 103. This new residue voltage $V_{res}(n)$ will be used to adjust $V_{IN}(n+1)$ on the next conversion. As a result, the output from the DAC 101 to the comparator 102 is:

$$V_{DAC}(n)=G*V_{IN}(n)+G*G_a*K_1*V_{res}(n-1)$$

where $K_1=C_1/(C_1+C_2)$.

Therefore, the effective amplifier input is:

$$V_{amp}(n)=V_{IN}(n)+G_a*K_1*V_{res}(n-1),$$

which simplifies to: $V_{amp}(n)=V_{IN}(n)+a*V_{res}(n-1)$.

$V_{DAC}(n)$ refers to the output voltage of the DAC 101 (and input voltage to the comparator 102) at the start of the successive approximation. At the end of the successive approximation, $V_{DAC}(n)=V_{res}(n)$.

$V_{amp}(n)$ refers to the effective output voltage of the DAC 101 referred back to the G input of the summing amplifier 302 (combining all inputs).

Figure 5:
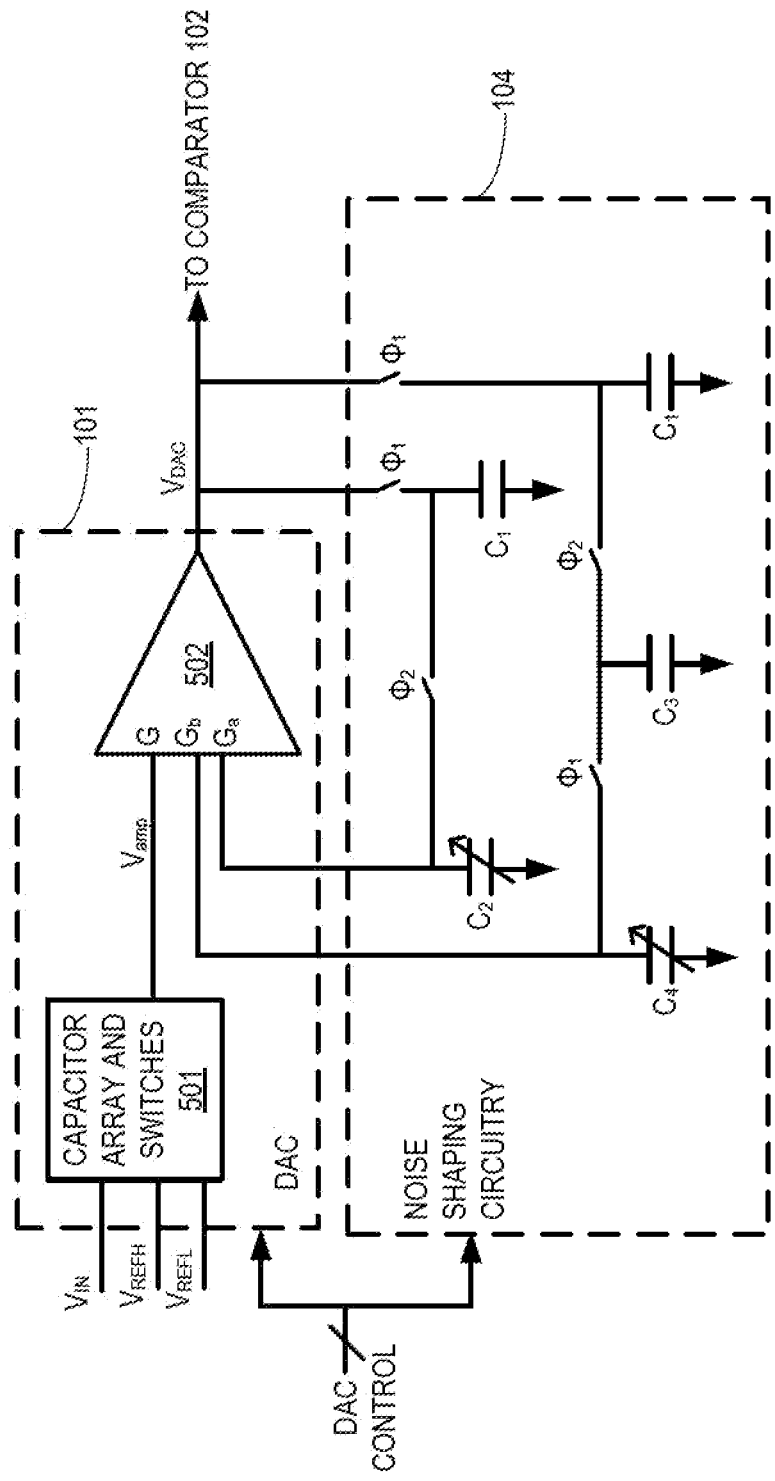
FIG. 5 illustrates a circuit block diagram of second order noise-shaping circuitry configured in accordance with embodiments of the present disclosure.

FIG. 5 illustrates a circuit block diagram of an example of $2^{nd}$ order noise-shaping circuitry configured in accordance with embodiments of the present disclosure, which may be utilized for the noise-shaping circuitry 104. The noise-shaping circuitry 104 is depicted as a single-ended implementation, but a differential implementation may also be configured in a similar manner. In the illustration of FIG. 5, the summing amplifier 502 is considered part of the DAC 101. FIG. 4 may again be referred to for exemplary timing of signals of the noise-shaping circuitry 101 of FIG. 5. The phases, $\phi_1$ and $\phi_2$, may be implemented utilizing switches within the noise-shaping circuitry 104 under control from DAC Control signals received from the SAR engine 103.

Referring to FIGS. 4-5, in phase $\phi_s$ of the $n^{th}$ conversion, the input $V_{IN}(n)$ is sampled onto the DAC capacitor array 501. In phase $\phi_2$, the residue voltage from the previous conversion, $V_{res}(n-1)$, is applied to a second input, $G_a$, of the summing amplifier 502. This effectively adjusts the input voltage $V_{IN}(n)$ by $a*V_{res}(n-1)$ as seen by the comparator 102. In the previous phase $\phi_1$ of conversion n-1, the residue $V_{res}(n-2)$ was applied to a third input, $G_b$, of the summing amplifier 502. The combination of the second and third amplifier paths provide an adjustment to $V_{IN}(n)$ of $a*V_{res}(n-1)+b*V_{res}(n-2)$. After the successive approximation is complete, the new residue voltage $V_{res}(n)$ is sampled on both $C_1$ capacitors. The residue voltages $V_{res}(n-1)$ and $V_{res}(n)$ will be used to adjust $V_{IN}(n+1)$ on the next conversion. As a result, the output from the DAC 101 to the comparator 102 is:

$$V_{DAC}(n)=G*V_{IN}(n)+G*G_a*K_1*V_{res}(n-1)+G*G_b*K_2*V_{res}(n-2)$$

where $K_1=C_1/(C_1+C_2)$ and $K_2=C_1/(C_1+C_3)*C_3/(C_3+C_4)$.

Therefore, the effective input to the summing amplifier 502 is:

$$V_{amp}(n)=V_{IN}(n)+G_a*K_1*V_{res}(n-1)+G_b*K_2*V_{res}(n-1),$$

which simplifies to: $V_{amp}(n)=V_{IN(n)}+a*V_{res}(n-1)+b*V_{res}(n-2)$

Figure 10:
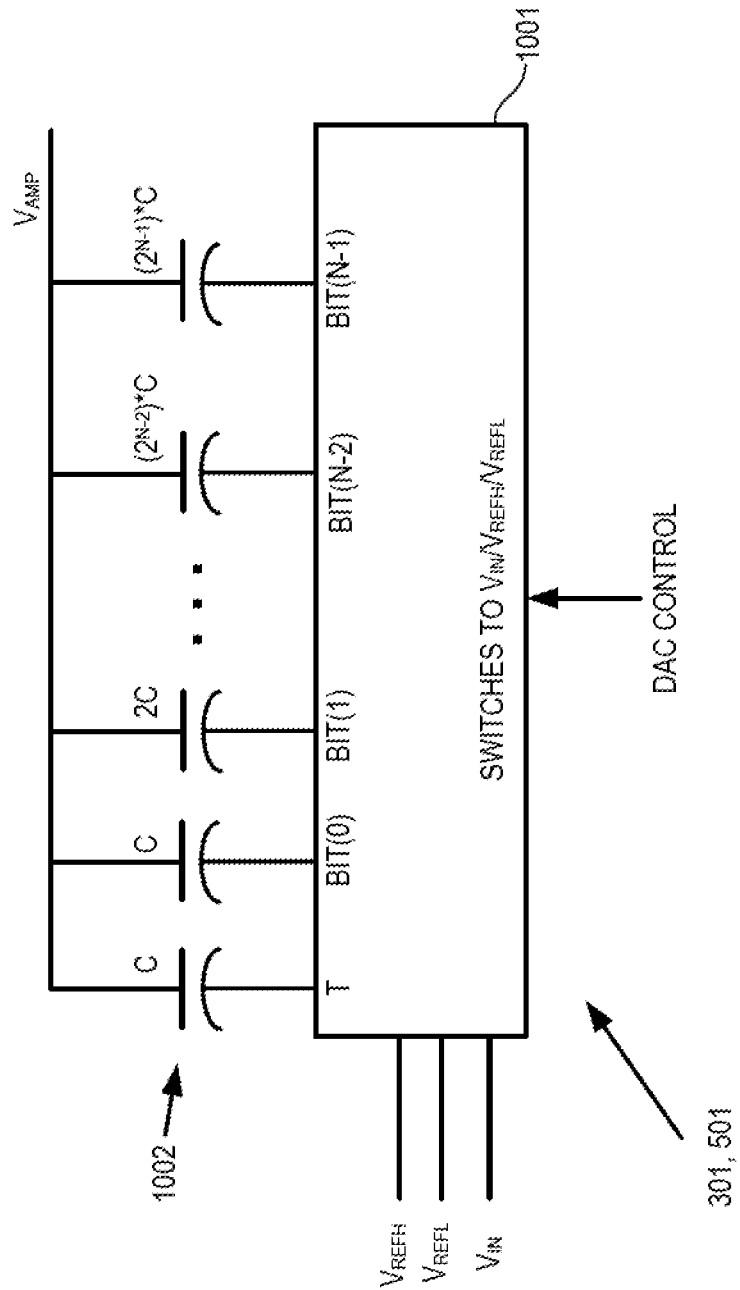
FIG. 10 illustrates an example of a capacitor array.
Figure 11:
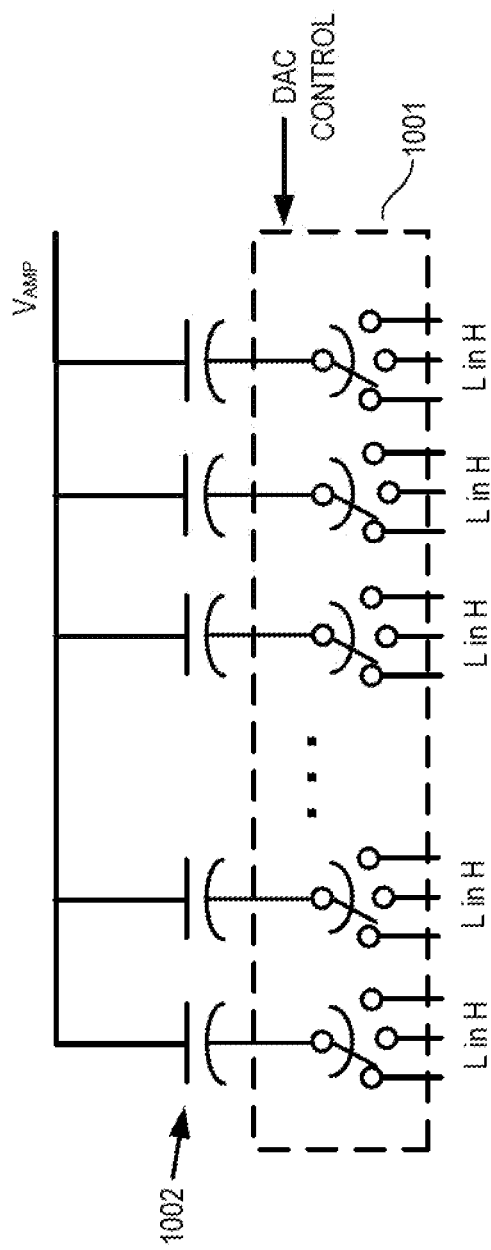
FIG. 11 illustrates operation of switches within the capacitor array of FIG. 10.

Referring to FIG. 10, there is illustrated an example of a capacitor array, which may be utilized for the capacitor arrays 301, 501. Switching circuitry 1001 receives the high voltage reference $V_{REFH}$, the low voltage reference $V_{REFL}$, and analog input signal $V_{IN}$, and each of these signals are coupled to a selected number of binary-weighted capacitors 1002 in response to DAC Control signals. This is further depicted in FIG. 11 showing how switches pertaining to each of the binary-weighted capacitors can be individually and selectively manipulated to select any of these three signals in response to DAC Control signals.

Figure 6:
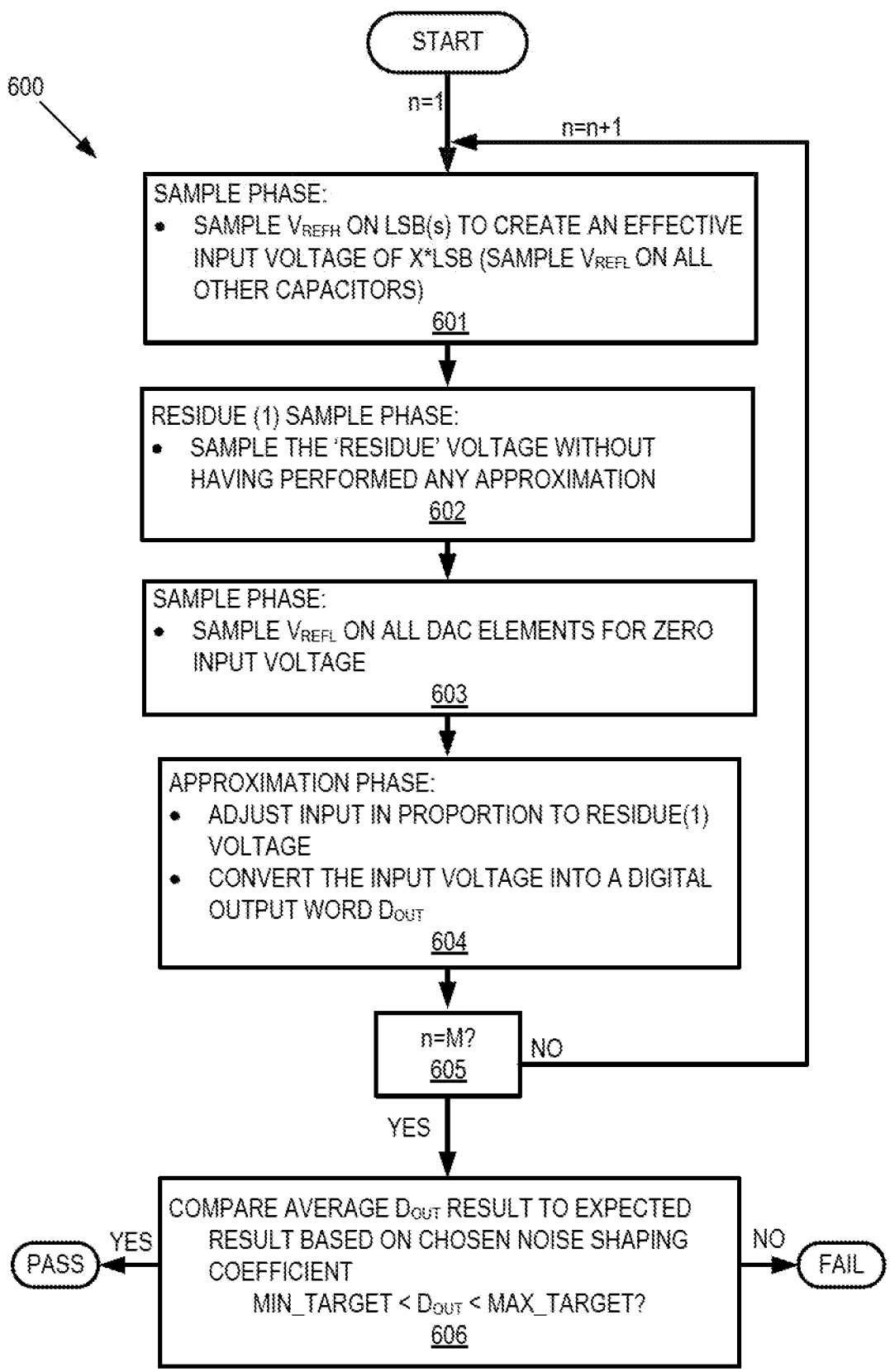
FIG. 6 illustrates a flowchart block diagram of a self-test of a first coefficient for $1^{st}$ order noise shaping within a noise-shaping SAR ADC in accordance with embodiments of the present disclosure.

FIG. 6 illustrates a flowchart block diagram of a self-test process 600 of a first coefficient for $1^{st}$ order noise shaping within a noise-shaping SAR ADC (e.g., the SAR ADC 100) in accordance with embodiments of the present disclosure. The process 600 may be implemented in software, hardware, or firmware, or a combination thereof, within the SAR engine 103, and be initiated under control of BIST Control signals. BIST Control signals may be part of DAC Control signals or may originate from another device coupled to the SAR ADC 100, or an external test apparatus.

In the process block 601, the DAC Control sets a value for X during a sample phase to sample X*LSB worth of charge (where $LSB=(V_{REFH}-V_{REFL})/2^N$, where LSB refers to the least significant bits, and N is the resolution of the SAR ADC 100). Referring to FIGS. 1 and 10-11, this may be performed by DAC Control signals sent from the SAR engine 103 to the DAC 101 in order to switch the $V_{REFH}$ voltage signal onto the capacitors associated with the selected X number of LSBs, while switching the $V_{REFL}$ voltage signal to the remaining capacitors within the capacitor array 1002. Effectively, the process block 601 produces a "fabricated" voltage input signal (X*LSB) utilizing these switched capacitors for output as the DAC output voltage signal ($V_{DAC}$). In other words, the "fabricated" voltage input signal is not actually received from the $V_{IN}$ input, but is instead produced inside of the DAC 101. The limit on how large X can be is determined by the noise-shaping circuitry in that it is to be selected such that the noise-shaping circuitry does not saturate (i.e., any gain elements remain within their linear output range).

In the process block 602, a "residue" voltage from the "fabricated" voltage input signal (i.e., X*LSB output as $V_{DAC}$) is sampled onto the $1^{st}$ order noise-shaping circuitry 104 (e.g., see FIG. 3). The approximation phase is skipped on this first pass, in that a conversion is not performed by the SAR engine 103 and/or an approximation performed by the SAR engine 103 is not fed back to the DAC 101. In the process block 603, a second conversion is initiated by setting all of the DAC elements (e.g., binary-weighted capacitors) to receive $V_{REFL}$ (e.g., DAC Control switches all of the capacitors in the capacitor array 1002 to receive the $V_{REFL}$ voltage signal, which may be coupled to a ground reference source). This results in the DAC 101 effectively sampling a zero-input voltage. In the process block 604, the input is adjusted as would typically be performed for noise shaping (i.e., add a*X*LSB, where a is the noise-shaping coefficient). That is, the zero-input voltage produced in the process block 603 is adjusted in proportion to the residue voltage produced in the process block 602.

The process blocks 601-604 may be repeated M times to average out any noise effects (see the process block 605). The number of times the test is repeated (M) can be chosen based on the tolerance for the design. For a given tolerance, selecting a larger X will allow a lower M because the input signal (X*LSB) will be large relative to the ADC noise (higher SNR).

The resulting $D_{OUT}$ (after averaging out noise) should be X*a. As a result, $a=(D_{OUT}/X)$.

Note that "adjusting the input voltage" may be performed by modifying the ADC circuitry in some manner to effectively adjust the sampled input voltage. This may be performed within the DAC 101, but could be performed utilizing a second comparator input path for a portion of the adjustment as well.

In the process block 606, the average $D_{OUT}$ result is compared to an expected result based on the selected value of the noise-shaping coefficient. Min_Target and Max_Target for the range of the expected result may be selected/determined based on the desired coefficient range. For example, if +/−2% is desired of a target coefficient a=1, and X=256 is selected, then the minimum and maximum targets would be 251 and 261. Regardless, for a selected noise-shaping coefficient, a selected value for X, and a desired tolerance for how much such a coefficient can vary, the Min_Target and Max_Target values can be determined. During the comparison in the process block 606, the average DOUT is determined as to whether it falls within this range (Pass) or out of this range (Fail). Such a Pass/Fail result can be output through the BIST Control signals to a designated device.

Note that the built-in compare function of the ADC can be utilized to determine such a Pass/Fail result.

In addition to having a Pass/Fail self-test, the noise-shaping coefficient can be measured:

$$a_{measured} = \frac{DOUT_{avg}}{X}$$

For example, if X=256 is selected, and an average $D_{OUT}$ result was 254.875, then the measured coefficient is a=0.9956.

Figure 7:
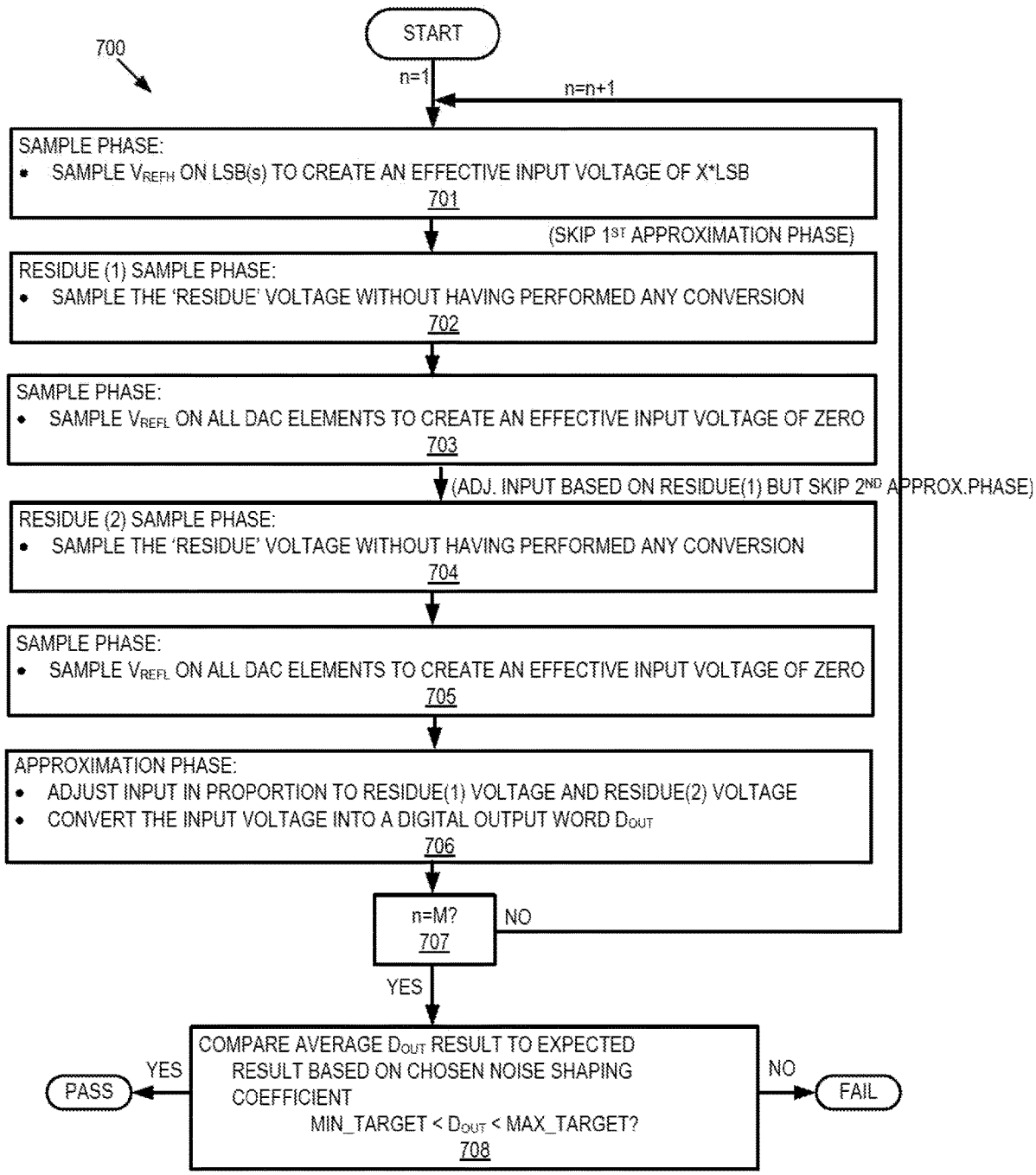
FIG. 7 illustrates a flowchart block diagram of a self-test of a second coefficient for $2^{nd}$ order noise shaping within a noise-shaping SAR ADC in accordance with embodiments of the present disclosure.

FIG. 7 illustrates a flowchart block diagram of a self-test process 700 of a second coefficient for $2^{nd}$ order noise shaping within a noise-shaping SAR ADC (e.g., the SAR ADC 100) in accordance with embodiments of the present disclosure. For $2^{nd}$ order noise shaping an additional test is utilized for the SAR ADC to test/determine its $2^{nd}$ noise-shaping coefficient b. The process 700 may be implemented in software/hardware/firmware within the SAR engine 103, and be initiated under control of BIST Control signals.

In the process block 701, the DAC Control sets a value for X during a sample phase to sample X*LSB worth of charge (where LSB=$(V_{REFH}-V_{REFL})/2^N$, where N is the resolution of the SAR ADC 100). Referring to FIGS. 1 and 10-11, this may be performed by DAC Control signals sent from the SAR engine 103 to the DAC 101 in order to switch the $V_{REFH}$ voltage signal onto the capacitors associated with the selected X number of LSBs, while switching the $V_{REFL}$ voltage signal to the remaining capacitors within the capacitor array 1002. Effectively, the process block 701 produces a "fabricated" voltage input signal (X*LSB) utilizing these switched capacitors for output as the DAC output voltage signal ($V_{DAC}$). In other words, the "fabricated" voltage input signal is not actually received from the $V_{IN}$ input, but is instead produced inside of the DAC 101. The limit on how large X can be is determined by the noise-shaping circuitry in that it is to be selected such that the noise-shaping circuitry does not saturate (i.e., any gain elements remain within their linear output range).

In the process block 702, a first "residue" voltage, $V_{res}(1)$, from the "fabricated" voltage input signal (i.e., X*LSB output as $V_{DAC}$) is sampled onto the $2^{nd}$ order noise-shaping circuitry 104 (e.g., see FIG. 5). The approximation phase is skipped on this first pass, in that a conversion is not performed by the SAR engine 103 and/or an approximation performed by the SAR engine 103 is not fed back to the DAC 101. In the process block 703, a second conversion is initiated by setting all of the DAC elements (e.g., binary-weighted capacitors) to receive $V_{REFL}$ (e.g., DAC Control switches all of the capacitors in the capacitor array 1002 to receive the $V_{REFL}$ voltage signal). This results in the DAC 101 effectively sampling a zero-input voltage. The input is adjusted as would typically be performed for noise shaping (i.e., add $a*V_{res}(1)$ to the zero-input voltage output by the capacitor array 1002, where a is the $1^{st}$ noise-shaping coefficient). That is, the zero-input voltage produced in the process block 703 is adjusted in proportion to the first "residue" voltage produced in the process block 702.

In the process block 704, a second "residue" voltage, $V_{res}(2)$, is sampled onto the $2^{nd}$ order noise-shaping circuitry 104 (e.g., see FIG. 5). The approximation phase is skipped again. In the process block 705, all of the DAC elements (e.g., binary-weighted capacitors) are set by the switching circuitry 1001 to receive $V_{REFL}$ (e.g., DAC Control switches all of the capacitors in the capacitor array 1002 to receive the $V_{REFL}$ voltage signal). This results in the DAC 101 effectively sampling a zero-input voltage. In the process block 706, this sampled zero-input voltage is then adjusted by $a*V_{res}(2)+b*V_{res}(1)$ as would typically be performed for noise shaping where a is the first coefficient and b is the second coefficient. That is, the zero-input voltage produced in the process block 705 is adjusted in proportion to the first residue voltage produced in the process block 702 and the second residue voltage produced in the process block 704.

The process blocks 701-706 may be repeated M times to average out any noise effects (see the process block 707). The number of times the test is repeated (M) can be chosen based on the tolerance for the design. For a given tolerance, selecting a larger X will allow a lower M because the input signal (X*LSB) will be large relative to the ADC noise (higher SNR).

The result $D_{OUT}$ (after averaging out noise) should be $D_{OUT}=X(a^2+b)$. Since a is already known, b can be determined, $b=D_{OUT}/X-a^2$ In the process block 708, the average $D_{OUT}$ result is compared to an expected result based on the selected value of the noise-shaping coefficients. Min_Target and Max_Target for the range of the expected result may be selected/determined based on the desired coefficient range. For example, if +/−2% is desired of a target coefficient b=−1, and X=256 is selected, and the first coefficient is measured as a=1.9912, then the minimum and maximum targets would be 753 and 764. The target Pass/Fail range could also be predetermined based on the target value for the coefficient a rather than the measured a value.

During the comparison in the process block 708, the average DOUT is determined as to whether it falls within this range (Pass) or out of this range (Fail). Such a Pass/Fail result can be output through the BIST Control signals to a designated device. Note that the built-in compare function of the ADC can be utilized to determine such a Pass/Fail result.

In addition to having a Pass/Fail self-test, the noise-shaping coefficient can be measured:

$$b_{measured} = \frac{DOUT_{avg}}{X} - a_{measured}^2$$

For example, if X=256 is selected, the first coefficient is measured as a=1.9912, and the average result was 756.125, then the measured second coefficient is b=−1.011

Figure 8:
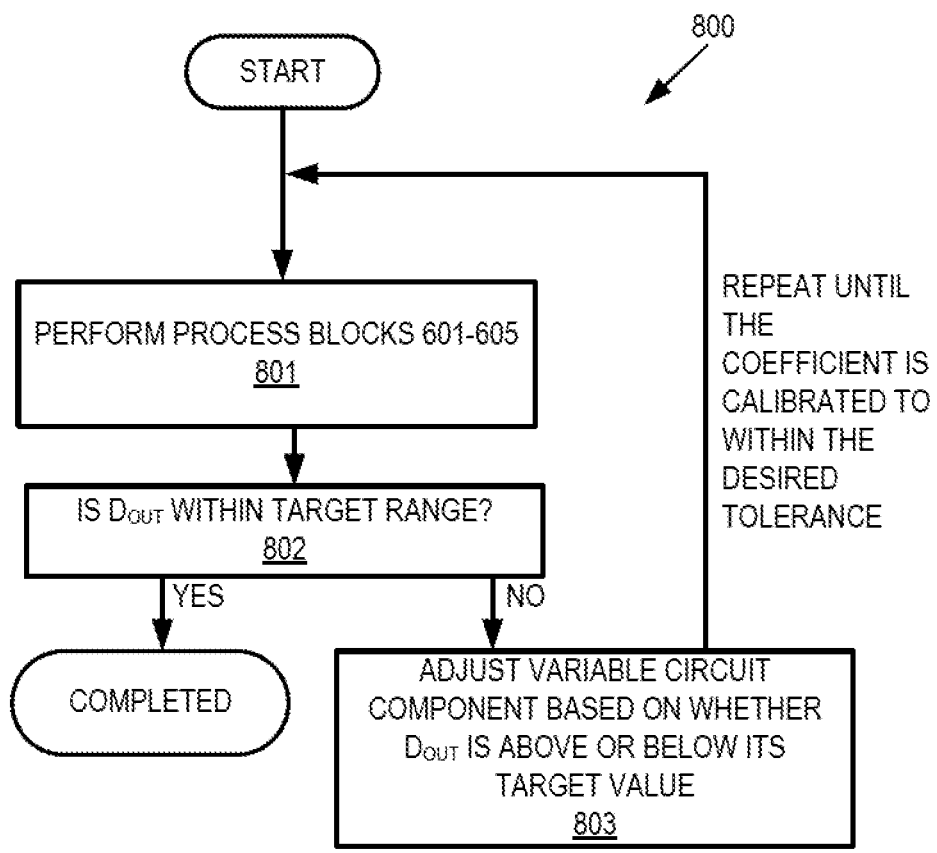
FIG. 8 illustrates a flowchart block diagram of calibration of a first coefficient for $1^{st}$ order noise shaping within a noise-shaping SAR ADC in accordance with embodiments of the present disclosure.
Figure 9:
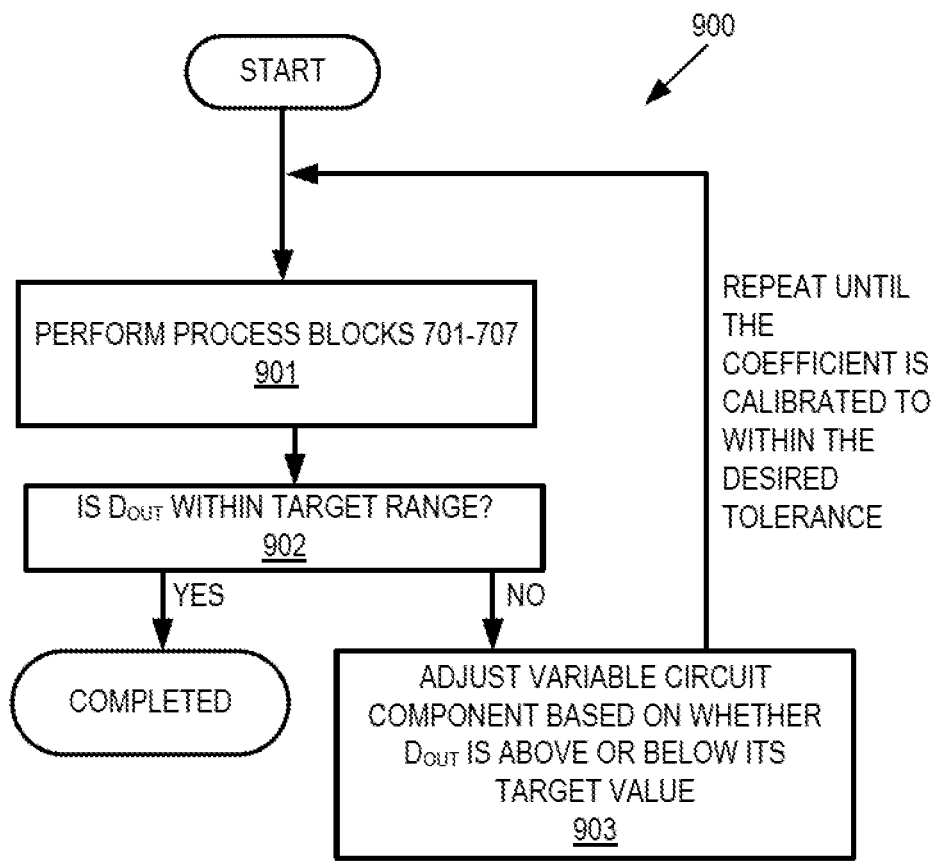
FIG. 9 illustrates a flowchart block diagram of calibration of a second coefficient for $2^{nd}$ order noise shaping within a noise-shaping SAR ADC in accordance with embodiments of the present disclosure.

Referring to FIGS. 8 and 9, using similar procedures as the processes 600, 700, the noise-shaping coefficients may be calibrated (e.g., through the utilization of trimmable circuit components).

FIG. 8 illustrates a flowchart block diagram of a process 800 for calibration/determination of a first coefficient, a, for $1^{st}$ order noise shaping within a noise-shaping SAR ADC (e.g., the noise-shaping SAR ADC 100) in accordance with embodiments of the present disclosure. In the process block 801, the process blocks 601-605 are performed M times. In the process block 802, a determination is made whether the result $D_{OUT}$ is within the target range. This can be performed in a similar manner as described with respect to the process block 606. If the result is outside of the target range, then in the process block 803, control signals may be altered in order to adjust a particular variable circuit component in a manner that would adjust the value of the coefficient a. For example, DAC Control signals may be sent to vary the capacitance of the variable capacitor $C_2$ (see FIG. 3). The process 800 may be repeated until the result is within a desired tolerance (e.g., within the desired target range).

FIG. 9 illustrates a flowchart block diagram of a process 900 for calibration/determination of a second coefficient, b, for $2^{nd}$ order noise shaping within a noise-shaping SAR ADC (e.g., the noise-shaping SAR ADC 100) in accordance with embodiments of the present disclosure. In the process block 901, the process blocks 701-707 are performed M times. In the process block 902, a determination is made whether the result $D_{OUT}$ is within the target range. This can be performed in a similar manner as described with respect to the process block 708. If the result is outside of the target range, then in the process block 903, control signals may be altered in order to adjust a particular variable circuit component in a manner that would adjust the value of the coefficient b. For example, DAC Control signals may be sent to vary the capacitance of the variable capacitors $C_2$ and/or $C_4$ (see FIG. 5). The process 900 may be repeated until the result is within a desired tolerance (e.g., within the desired target range).

The following are various embodiments configured in accordance with the present disclosure.

An aspect of the present disclosure provides a method for testing noise-shaping circuitry in a successive approximation register analog-to-digital converter ("SAR ADC"), wherein the method includes producing a first digital-to-analog converter ("DAC") output voltage signal having a predetermined non-zero voltage value, sampling a residue voltage from the first DAC output voltage signal with the noise-shaping circuitry, producing a second DAC output voltage signal having a zero-voltage value, adjusting the second DAC output voltage signal with the sampled residue voltage to produce an adjusted DAC output voltage signal, converting the adjusted DAC output voltage signal into a digital output word, and determining whether the digital output word has a value within an expected range. The method may further include adjusting a coefficient of the noise-shaping circuitry when the digital output word does not have a value within the expected range. The adjusting the coefficient of the noise-shaping circuitry may include adjusting a capacitance value of a variable capacitor. The DAC may include a capacitor array of a plurality of binary-weighted capacitors coupled in parallel, and a switching network configured to selectively couple each of the binary-weighted capacitors to an analog voltage input, a high voltage reference, and a low voltage reference, wherein the high voltage reference is greater than the low voltage reference. The first DAC output voltage signal may be produced by the switching network coupling a predetermined number of the binary-weighted capacitors to the high voltage reference. The second DAC output voltage signal may be produced by the switching network coupling all of the binary-weighted capacitors to the low voltage reference, wherein the low voltage reference is coupled to a ground reference. In accordance with an aspect of the present disclosure, an SAR approximation on the first DAC output voltage signal is not returned to the DAC.

An aspect of the present disclosure provides a SAR ADC that includes a DAC configured to receive an input voltage signal, a high voltage reference, and a low voltage reference; a first comparator having a first input coupled to an output of the DAC, and a second input configured to receive a common mode voltage; noise-shaping circuitry configured to sample a residue voltage from the output of the DAC, and to send the residue voltage to the DAC; circuitry configured to produce a first DAC output voltage signal having a predetermined non-zero voltage value; circuitry configured to sample a residue voltage from the first DAC output voltage signal with the noise-shaping circuitry; circuitry configured to produce a second DAC output voltage signal having a zero-voltage value; circuitry configured to adjust the second DAC output voltage signal with the sampled residue voltage to produce an adjusted DAC output voltage signal; and a SAR having an input coupled to an output of the first comparator, wherein the SAR is configured to convert the adjusted DAC output voltage signal into a digital output word. The SAR ADC may further include circuitry configured to determine whether the digital output word has a value within an expected range. The SAR ADC may further include circuitry configured to adjust a coefficient of the noise-shaping circuitry when the digital output word does not have a value within the expected range. The adjusting the coefficient of the noise-shaping circuitry may include adjusting a value of a variable element within the noise-shaping circuitry. The SAR ADC may further include circuitry configured to determine a value of a coefficient of the noise-shaping circuitry as a function of the digital output word. The DAC may include a capacitor array of a plurality of binary-weighted capacitors coupled in parallel, and a switching network configured to selectively couple each of the binary-weighted capacitors to an analog voltage input, a high voltage reference, and a low voltage reference, wherein the high voltage reference is greater than the low voltage reference, wherein the circuitry configured to produce a first DAC output voltage signal includes configuring the switching network to couple a predetermined number of the binary-weighted capacitors associated with least significant bits of the DAC to the high voltage reference, and wherein the circuitry configured to produce a second DAC output voltage signal includes configuring the switching network to couple the binary-weighted capacitors to the low voltage reference. The noise-shaping circuitry may be configured as a 1st order noise-shaping circuitry. Alternatively, the noise-shaping circuitry may be configured as a 2nd order noise-shaping circuitry. The SAR may be configured to not perform an approximation on the first DAC output voltage signal.

An aspect of the present disclosure provides a method for testing 2nd order noise-shaping circuitry in a SAR ADC, wherein the method includes producing a first DAC output voltage signal having a predetermined non-zero voltage value, sampling a first residue voltage from the first DAC output voltage signal with the noise-shaping circuitry, producing a second DAC output voltage signal having a zero-voltage value, wherein the second DAC output voltage signal is produced without receiving an approximation from the SAR, adjusting the second DAC output voltage signal with the first sampled residue voltage to produce a first adjusted DAC output voltage signal, wherein the first adjusted DAC output voltage signal is produced without receiving an approximation from the SAR, sampling a second residue voltage from the first adjusted DAC output voltage signal with the noise-shaping circuitry, producing a third DAC output voltage signal having a zero-voltage value, adjusting the third DAC output voltage signal with the second sampled residue voltage to produce a second adjusted DAC output voltage signal, and converting the second adjusted DAC output voltage signal into a digital output word. The method may further include determining whether the digital output word has a value within an expected range. The method may further include determining a value of a coefficient of the noise-shaping circuitry when the digital output word does not have a value within the expected range. The DAC may include a capacitor array of a plurality of binary-weighted capacitors coupled in parallel, and a switching network configured to selectively couple each of the binary-weighted capacitors to an analog voltage input, a high voltage reference, and a low voltage reference, wherein the high voltage reference is greater than the low voltage reference, wherein the first DAC output voltage signal is produced by the switching network coupling a predetermined number of the binary-weighted capacitors to the high voltage reference, and wherein the second DAC output voltage signal is produced by the switching network coupling all of the binary-weighted capacitors to the low voltage reference, and wherein the low voltage reference is coupled to a ground reference.

Although embodiments of the present disclosure are described herein with reference to specific embodiments, various modifications and changes can be made without departing from the scope of the present disclosure as set forth in the claims below. For example, although a single-ended ADC is illustrated, the above calibration can also be applied to a differential ADC. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims. It should be appreciated that the particular implementations and applications shown and described herein may be illustrative of the disclosure and are not intended to otherwise limit the scope of the present disclosure in any way. Other variations may be within the scope of the following claims. Headings herein are not intended to limit the disclosure, embodiments of the disclosure, or other matter disclosed under the headings.

In accordance with embodiments of the present disclosure, the illustrated elements of the SAR ADC 100 may be implemented as circuitry located on a single integrated circuit or within a same device. Alternatively, the SAR ADC 100 may include any number of separate integrated circuits or separate devices interconnected with each other. Furthermore, those skilled in the art will recognize that boundaries between the functionality of the above-described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Reference throughout this specification to "an embodiment," "embodiments," "certain embodiments," "various embodiments," or similar language means that a particular feature, structure, or characteristic described in connection with the embodiments is included in at least one embodiment of the present disclosure. Thus, appearances of the phrases "in embodiments," "in an embodiment," "embodiments," "in certain embodiments," and similar language throughout this specification may, but do not necessarily, all refer to the same embodiment. Furthermore, the described features, structures, aspects, or characteristics of the disclosure may be combined in any suitable manner in one or more embodiments. Correspondingly, even if features may be initially claimed as acting in certain combinations, one or more features from a claimed combination can in some cases be excised from the combination, and the claimed combination can be directed to a sub-combination or variation of a sub-combination.

The terminology used herein is for the purpose of describing particular embodiments and applications only and is not intended to be limiting of the disclosure. In the descriptions herein, numerous specific details are provided, such as examples of activities, circumstances, services, faults, errors, responses, reactions, processor activities, operations, events, mechanisms, software threads, signals, or actions, programming, software modules, designer, manufacturer, or end user selections, network transactions, database queries, database structures, hardware modules, hardware circuits, hardware chips, controllers, etc., to provide a thorough understanding of embodiments of the disclosure. One skilled in the relevant art will recognize, however, that the disclosure may be practiced without one or more of the specific details, or with other processes, methods, components, materials, activities, circumstances, services, faults, errors, responses, reactions, processor activities, operations, events, mechanisms, software threads, signals, and so forth. In other instances, well-known structures, materials, or operations may be not shown or described in detail to avoid obscuring aspects of the disclosure.

Aspects of the present disclosure are described herein with reference to flowchart illustrations and/or block diagrams of processes, methods, apparatus (systems), and computer program products according to embodiments of the present disclosure. It will be understood that each block of the flowchart illustrations and/or block diagrams, and combinations of blocks in the flowchart illustrations and/or block diagrams, can be implemented by software, hardware, firmware, and a combination of any of the foregoing.

In the description herein, a flow-charted technique may be described in a series of sequential actions. The sequence of the actions, and the element performing the actions, may be freely changed without departing from the scope of the teachings. Actions may be added, deleted, or altered in several ways. Similarly, the actions may be re-ordered or looped. Further, although processes, methods, algorithms, or the like may be described in a sequential order, such processes, methods, algorithms, or any combination thereof may be operable to be performed in alternative orders. Further, some actions within a process, method, or algorithm may be performed simultaneously during at least a point in time (e.g., actions performed in parallel), and can also be performed in whole, in part, or any combination thereof.

Reference may be made herein to a device, circuit, circuitry, system, or module "configured to" perform a particular function or functions. It should be understood that this may include selecting predefined logic blocks and logically associating them, such that they provide particular logic functions, which includes monitoring or control functions. It may also include programming computer software-based logic, wiring discrete hardware components, or a combination of any or all of the foregoing.

To the extent not described herein, many details regarding specific materials, processing acts, and circuits are conventional, and may be found in textbooks and other sources within the computing, electronics, and software arts.

Herein, the term "or" may be intended to be inclusive, wherein "A or B" includes A or B and also includes both A and B. As used herein, the term "or" when used in the context of a listing of entities, refers to the entities being present singly or in combination. Thus, for example, the phrase "A, B, C, or D" includes A, B, C, and D individually, but also includes any and all combinations and subcombinations of A, B, C, and D. As used herein, the term "and/or" when used in the context of a listing of entities, refers to the entities being present singly or in combination. Thus, for example, the phrase "A, B, C, and/or D" includes A, B, C, and D individually, but also includes any and all combinations and subcombinations of A, B, C, and D.

The corresponding structures, materials, acts, and equivalents of all means or step plus function elements in the claims may be intended to include any structure, material, or act for performing the function in combination with other claimed elements as specifically claimed.

Although embodiments of the present disclosure have been described with respect to specific conductivity types or polarity of potentials, skilled artisans will appreciate that conductivity types and polarities of potentials may be reversed. The term "coupled," as used herein, is not intended to be limited to a direct coupling or a mechanical coupling. Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for testing noise-shaping circuitry in a successive approximation register analog-to-digital converter ("SAR ADC"), the method comprising:
    producing a first digital-to-analog converter ("DAC") output voltage signal having a predetermined non-zero voltage value;
    sampling a residue voltage from the first DAC output voltage signal with the noise-shaping circuitry;
    producing a second DAC output voltage signal having a zero-voltage value;
    adjusting the second DAC output voltage signal with the sampled residue voltage to produce an adjusted DAC output voltage signal;
    converting the adjusted DAC output voltage signal into a digital output word; and
    determining whether the digital output word has a value within an expected range.

2. The method as recited in claim 1, further comprising adjusting a coefficient of the noise-shaping circuitry when the digital output word does not have a value within the expected range.

3. The method as recited in claim 2, wherein adjusting the coefficient of the noise-shaping circuitry comprises adjusting a capacitance value of a variable capacitor.

4. The method as recited in claim 1, wherein the DAC comprises:
    a capacitor array of a plurality of binary-weighted capacitors coupled in parallel; and
    a switching network configured to selectively couple each of the binary-weighted capacitors to an analog voltage input, a high voltage reference, and a low voltage reference, wherein the high voltage reference is greater than the low voltage reference.

5. The method as recited in claim 4, wherein the first DAC output voltage signal is produced by the switching network coupling a predetermined number of the binary-weighted capacitors to the high voltage reference.

6. The method as recited in claim 5, wherein the second DAC output voltage signal is produced by the switching network coupling all of the binary-weighted capacitors to the low voltage reference, wherein the low voltage reference is coupled to a ground reference.

7. The method as recited in claim 1, wherein an SAR approximation on the first DAC output voltage signal is not returned to the DAC.

8. A successive approximation register analog-to-digital converter ("SAR ADC") comprising:
    a digital-to-analog converter ("DAC") configured to receive an input voltage signal, a high voltage reference, and a low voltage reference;
    a first comparator having a first input coupled to an output of the DAC, and a second input configured to receive a common mode voltage;
    noise-shaping circuitry configured to sample a residue voltage from the output of the DAC, and to send the residue voltage to the DAC;
    circuitry configured to produce a first DAC output voltage signal having a predetermined non-zero voltage value;
    circuitry configured to sample a residue voltage from the first DAC output voltage signal with the noise-shaping circuitry;
    circuitry configured to produce a second DAC output voltage signal having a zero-voltage value;
    circuitry configured to adjust the second DAC output voltage signal with the sampled residue voltage to produce an adjusted DAC output voltage signal; and
    a successive approximation register ("SAR") having an input coupled to an output of the first comparator, wherein the SAR is configured to convert the adjusted DAC output voltage signal into a digital output word.

9. The SAR ADC as recited in claim 8, further comprising circuitry configured to determine whether the digital output word has a value within an expected range.

10. The SAR ADC as recited in claim 9, further comprising circuitry configured to adjust a coefficient of the noise-shaping circuitry when the digital output word does not have a value within the expected range.

11. The SAR ADC as recited in claim 10, wherein adjusting the coefficient of the noise-shaping circuitry comprises adjusting a value of a variable element within the noise-shaping circuitry.

12. The SAR ADC as recited in claim 8, further comprising circuitry configured to determine a value of a coefficient of the noise-shaping circuitry as a function of the digital output word.

13. The SAR ADC as recited in claim 8, wherein the DAC comprises:
    a capacitor array of a plurality of binary-weighted capacitors coupled in parallel; and
    a switching network configured to selectively couple each of the binary-weighted capacitors to an analog voltage input, a high voltage reference, and a low voltage reference, wherein the high voltage reference is greater than the low voltage reference,
    wherein the circuitry configured to produce a first DAC output voltage signal comprises configuring the switching network to couple a predetermined number of the binary-weighted capacitors associated with least significant bits of the DAC to the high voltage reference, and
    wherein the circuitry configured to produce a second DAC output voltage signal comprises configuring the switching network to couple the binary-weighted capacitors to the low voltage reference.

14. The SAR ADC as recited in claim 8, wherein the noise-shaping circuitry is configured as a $1^{st}$ order noise-shaping circuitry.

15. The SAR ADC as recited in claim 8, wherein the noise-shaping circuitry is configured as a $2^{nd}$ order noise-shaping circuitry.

16. The SAR ADC as recited in claim 8, wherein the SAR is configured to not perform an approximation on the first DAC output voltage signal.

17. A method for testing $2^{nd}$ order noise-shaping circuitry in a successive approximation register ("SAR") analog-to-digital converter ("ADC"), the method comprising:
    producing a first digital-to-analog converter ("DAC") output voltage signal having a predetermined non-zero voltage value;
    sampling a first residue voltage from the first DAC output voltage signal with the noise-shaping circuitry;
    producing a second DAC output voltage signal having a zero-voltage value, wherein the second DAC output voltage signal is produced without receiving an approximation from the SAR;
    adjusting the second DAC output voltage signal with the first sampled residue voltage to produce a first adjusted DAC output voltage signal, wherein the first adjusted DAC output voltage signal is produced without receiving an approximation from the SAR;

sampling a second residue voltage from the first adjusted DAC output voltage signal with the noise-shaping circuitry;

producing a third DAC output voltage signal having a zero-voltage value;

adjusting the third DAC output voltage signal with the second sampled residue voltage to produce a second adjusted DAC output voltage signal; and converting the second adjusted DAC output voltage signal into a digital output word.

18. The method as recited in claim 17, further comprising determining whether the digital output word has a value within an expected range.

19. The method as recited in claim 18, further comprising determining a value of a coefficient of the noise-shaping circuitry when the digital output word does not have a value within the expected range.

20. The method as recited in claim 17, wherein the DAC comprises:

a capacitor array of a plurality of binary-weighted capacitors coupled in parallel; and a switching network configured to selectively couple each of the binary-weighted capacitors to an analog voltage input, a high voltage reference, and a low voltage reference, wherein the high voltage reference is greater than the low voltage reference, wherein the first DAC output voltage signal is produced by the switching network coupling a predetermined number of the binary-weighted capacitors to the high voltage reference, wherein the second DAC output voltage signal is produced by the switching network coupling all of the binary-weighted capacitors to the low voltage reference, wherein the low voltage reference is coupled to a ground reference.

* * * * *